(12) United States Patent
Stanescu et al.

(10) Patent No.: US 12,445,100 B2
(45) Date of Patent: Oct. 14, 2025

(54) CHOPPER-STABILIZED AMPLIFIER

(71) Applicant: SEMICONDUCTOR COMPONENTS INDUSTRIES, LLC, Scottsdale, AZ (US)

(72) Inventors: Cornel D. Stanescu, Bucharest (RO); Adrian Constantin Veselu, Bucharest (RO)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 174 days.

(21) Appl. No.: 18/185,441

(22) Filed: Mar. 17, 2023

(65) Prior Publication Data

US 2024/0313719 A1    Sep. 19, 2024

(51) Int. Cl.
    *G01R 19/00*   (2006.01)
    *H03F 3/393*   (2006.01)
    *H03F 3/45*    (2006.01)

(52) U.S. Cl.
    CPC ......... *H03F 3/393* (2013.01); *G01R 19/0023* (2013.01); *H03F 3/45475* (2013.01); *H03F 2203/45248* (2013.01)

(58) Field of Classification Search
    None
    See application file for complete search history.

(56) References Cited

U.S. PATENT DOCUMENTS

| | | | | |
|---|---|---|---|---|
| 7,733,169 B2 * | 6/2010 | Zhang | ..................... | H03F 3/005 330/9 |
| 7,999,710 B2 * | 8/2011 | Matthews | ............... | H03M 3/34 341/143 |
| 9,391,571 B2 * | 7/2016 | Stanescu | ............. | H03F 3/45475 |
| 10,411,664 B2 * | 9/2019 | Stanescu | ................ | H03F 3/387 |
| 10,797,661 B2 * | 10/2020 | Chen | ......................... | H03F 1/26 |
| 10,911,004 B2 * | 2/2021 | Subramanian | .......... | H03F 3/387 |
| 11,139,789 B1 * | 10/2021 | Kusuda | .................... | H03F 3/393 |
| 11,611,320 B2 * | 3/2023 | Stanescu | ............. | H03F 3/45632 |

(Continued)

OTHER PUBLICATIONS

European Extended Search Report for counterpart application No. 23218786.4, dated May 24, 2024, 13 pages.

(Continued)

*Primary Examiner* — Jermele M Hollington
(74) *Attorney, Agent, or Firm* — Brake Hughes Bellermann LLP

(57) ABSTRACT

A high-voltage chopper-stabilized amplifier can include two paths to compensate for non-ideal electrical parameters. A first path, leading to a primary input of the amplifier, may include a first mux interface circuit to limit voltages at the primary input of the amplifier. A second path, leading to an auxiliary input of the amplifier, may include a chopper amplifier circuit. Despite the first mux interface circuit, a slew condition on the first path may excite a current in the second path that can negatively affect the signal source. Accordingly, the disclosed amplifier further includes a second mux interface circuit that can decouple the second path while a slew condition. The second mux interface circuit is driven by a window floating comparator, which is supplied according to the voltages on primary input. A settling enhancer circuit keeps, during slew condition, certain nodes on the second path at a reference voltage.

20 Claims, 7 Drawing Sheets

(56) References Cited

U.S. PATENT DOCUMENTS

| | | | |
|---|---|---|---|
| 11,695,374 B2* | 7/2023 | Paladugu | H03F 3/45475 |
| | | | 330/9 |
| 2009/0278597 A1* | 11/2009 | Zhang | H03F 3/387 |
| | | | 330/9 |
| 2010/0327887 A1* | 12/2010 | Denison | H03F 3/45475 |
| | | | 324/123 R |
| 2012/0169416 A1* | 7/2012 | Gupta | H03F 1/0205 |
| | | | 330/9 |
| 2015/0207477 A1* | 7/2015 | Stanescu | H03F 3/387 |
| | | | 330/9 |
| 2015/0207573 A1 | 7/2015 | Diab et al. | |
| 2016/0006403 A1 | 1/2016 | Ivanov et al. | |
| 2019/0131943 A1 | 5/2019 | Chen et al. | |
| 2019/0207573 A1* | 7/2019 | Stanescu | H03K 19/017509 |
| 2022/0069789 A1* | 3/2022 | Stanescu | H03F 3/45475 |
| 2022/0231639 A1 | 7/2022 | Paladugu et al. | |

OTHER PUBLICATIONS

Texas Instruments, "OPAx189 Precision, Lowest-Noise, 36-V, Zero-Drift, 14-MHz, MUX-Friendly, Rail-to-Rail Output Operational Amplifiers," Dec. 2, 2017, pp. 1-54, XP093161261, Retrieved from the Internet on May 11, 2024: URL:https://www.ti.com/lit/ds/symlink/opal89.pdf?ts=1715351790032&ref_url=https%3A%2F%2Fro.mouser.com%2F.

Alani et al., "MOX-Friendly, Precision Operational Amplifiers", Dec. 31, 2022, pp. 1-4, XP093161267, Retrieved from Internet on May 11, 2024: URL:https://www.ti.com/lit/ab/sbot040c/sbot040c.pdf?ts=1715549905227.

* cited by examiner

CHOPPER-STABILIZED AMPLIFIER

FIELD OF THE DISCLOSURE

The present disclosure relates to microelectronic circuits and more specifically to a chopper-stabilized amplifier circuit.

BACKGROUND

The operational amplifier is a building block for a wide range of analog circuits. The precision and accuracy of the operational amplifier (i.e., opamp) can be improved using chopper stabilization, which uses modulation and filtering to reduce offset and drift in the amplification. For example, chopper stabilization can have better performance in input offset voltage (VOS), common-mode rejection ratio (CMRR), power-supply rejection ratio (PSRR), and open-loop gain (AvoL). As a result, chopper stabilized opamps may be desirable because their use can reduce the need for external circuitry to compensate for less than perfect operation of the opamp.

SUMMARY

In some aspects, the techniques described herein relate to a chopper-stabilized amplifier including: a main amplifier including a primary input configured to receive an inner input signal from a first path and an auxiliary input configured to receive a compensation signal from a second path; a first mux-interface circuit in the first path configured to limit the inner input signal received at the primary input of the main amplifier; a chopper amplifier circuit in the second path configured to receive the inner input signal from the first path and to output the compensation signal to the auxiliary input; a second mux-interface circuit in the second path configured to couple and decouple the chopper amplifier circuit to and from the first path; and a slew-detector circuit coupled to the first path and configured to: detect that the inner input signal is in a slew condition; and transmit, in response to the detection, a slew signal to configure the second mux-interface circuit to decouple the second path from the first path while the inner input signal is in the slew condition.

In some aspects, the techniques described herein relate to a method to reduce an in-rush of input current to a chopper-stabilized amplifier during a slew condition, the method including: receiving an input signal at an input at a first mux-interface circuit, the first mux-interface circuit configured to output an inner input signal to a first path of the chopper-stabilized amplifier, the first path between the input and a primary input of a main amplifier; coupling the inner input signal from the first path to a second path of the chopper-stabilized amplifier, the second path between a coupling node pair on the first path and an auxiliary input of the main amplifier; detecting a slew condition on the first path using a slew-detector circuit; controlling, based on the slew condition, a second mux-interface circuit positioned on the second path between the coupling node pair and a chopper amplifier circuit; and blocking, using the second mux-interface circuit, a low-impedance path in the chopper amplifier circuit to reduce the in-rush of input current to the chopper-stabilized amplifier during the slew condition.

In some aspects, the techniques described herein relate to a multiplexed measurement system including: a multiplexer configured to couple a plurality of measurements to an output; and a chopper-stabilized amplifier configured to receive an input signal from the output of the multiplexer, the chopper-stabilized amplifier including: a first mux-friendly interface circuit configured to receive the input signal and to output an inner input signal to a first path, the first mux-friendly interface circuit further configured to limit an input voltage of the input signal without increasing an input current of the input signal; a main amplifier including a primary input configured to receive the inner input signal from the first path and an auxiliary input configured to receive a compensation signal from a second path; a chopper amplifier circuit in the second path configured to receive the inner input signal from the first path and to output the compensation signal to the auxiliary input; a second mux-friendly interface circuit in the second path configured to couple and decouple the chopper amplifier circuit to and from the first path; and a slew-detector circuit coupled to the first path and configured to detect that the inner input signal is in a slew condition and transmit, in response to the detection, a slew signal to configure the second mux-friendly interface circuit to decouple the second path from the first path while the input signal is in the slew condition.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

Chopper stabilization can improve the performance (e.g., accuracy, noise, etc.) of an operational amplifier (i.e., amplifier) but can require added complexity. This complexity may become impractical for applications requiring multiple measurements. Multiplexing may allow multiple measurements to use the same chopper-stabilized amplifier for processing (e.g., buffering/amplifying before digitization) the measurements. Multiplexing, however, may place added requirements on the chopper-stabilized amplifier.

Figure 1:
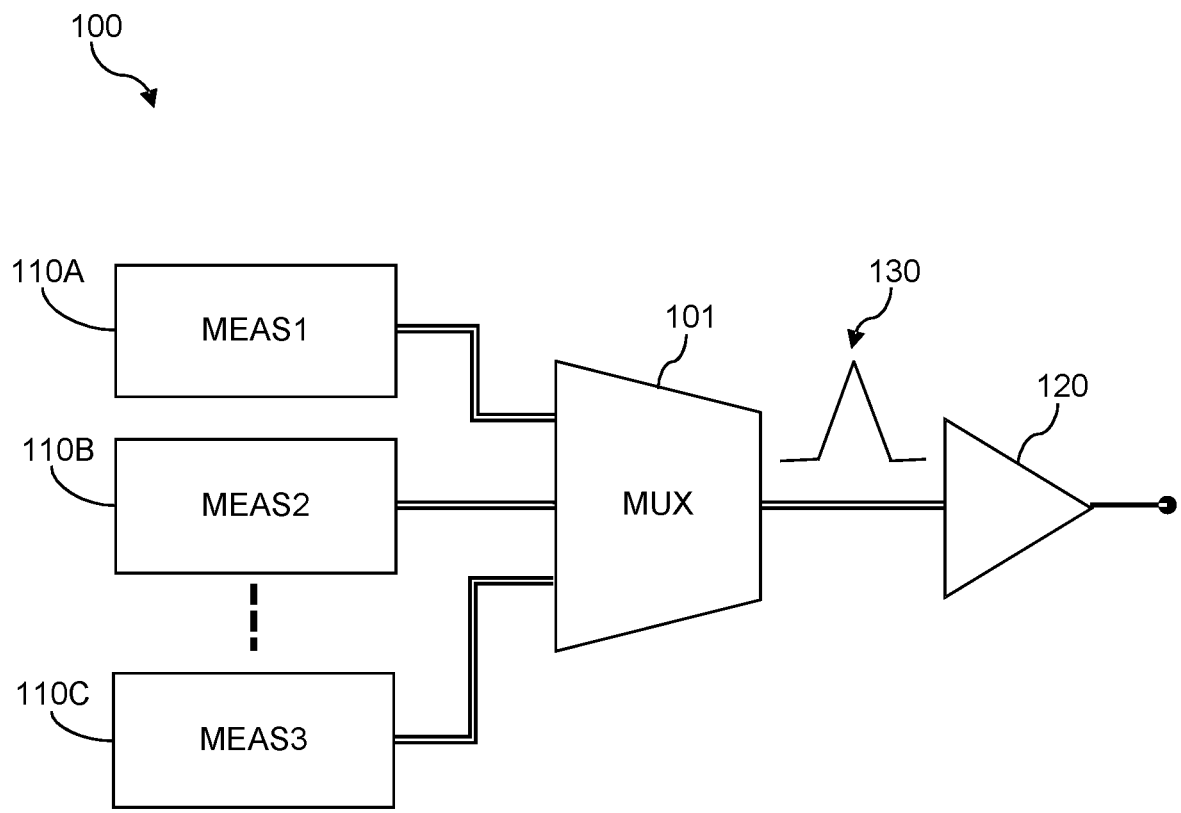
FIG. 1 illustrates a multiplexed measurement system according to an implementation of the present disclosure.

FIG. 1 illustrates a multiplexed measurement system according to an implementation of the present disclosure.

The multiplexed measurement system 100 can include a multiplexer 101. The multiplexer 101 (i.e., mux) may receive measurements 110A, 110B, 110C, which can be from a variety of different circuits (i.e., different currents/voltages). Each of these different measurements 110A-C may be output (in sequence) to an operational amplifier (i.e., amplifier 120). In some cases, the multiplexer 101 may add a transient signal (i.e., transient 130) to a measurement. For example, the multiplexer 101 may generate a transient 130 as a result of quickly switching between the measurements 110A-C. The transient can create a slew condition in amplifier 120.

An operational amplifier, as disclosed, may have two operating modes. A first operating mode is the normal condition, which corresponds with small-signal processing. In the normal condition, the input voltages of the circuit, either primary or auxiliary, are small (e.g., within +1 mV). Because of this, the operating points of all devices are proper, meaning that all devices on the signal paths are in the active region. This includes the transistors in all input stages, either primary or auxiliary.

A second operating mode of the disclosed amplifier is a slew condition, which corresponds with large-signal processing. In the slew condition, large input signals, which are quickly changing (i.e., fast), may un-balance a primary input stage of the amplifier so that one transistor takes all the available current, while another transistor is cut-off. This condition may result in a temporary interruption of a negative-feedback loop and a (sizable) increase of the input voltage of the circuit. For example, the input voltage to the circuit may increase until it is comparable to the input signal itself. As a result, the output of the circuit will compensate for the fast and large input signal by changing with a high speed. This high speed may be the maximum slew-rate of the amplifier. Accordingly, this operating mode can be considered as a slew condition.

Detecting the slew condition as early as possible, in order to do certain signal processing improvements during it, can be obtained by using a comparator which monitors the primary input voltage. It may have a controlled and narrow window i.e., +50 mV. Nevertheless, if considering high-voltage amplifiers, this window comparator needs to be a floating one, its supply voltages being correlated with the voltages on the primary input terminals, VINTP and VINTN; voltages which may be anywhere between the negative supply rail and 1.5V short of the positive supply rail.

A transient 130 can affect the performance and/or operation of the amplifier 120 in a variety of ways. First, during the transient (i.e., while the amplifier 130 is in a slew condition), the amplifier 120 may experience a large voltage (e.g., differential voltage) at the input, which can damage the amplifier 120 in the absence of an input circuit protection. Second, during the transient 130, even if an input circuit protection is provided, the amplifier 120 may experience a large in-rush of current at the input, which can alter a measurement due to loading (i.e., low impedance). Third, the amplifier 120 may output erroneous measurements if it responds too slowly to the changing measurements at the input. When these outcomes are avoided, the amplifier 120 is said to be "multiplexer-friendly" or "mux-friendly." Circuits can be included in the amplifier 120 to interface with the multiplexer in order to provide these "mux-friendly" features. These circuits may take time to recover after the transient 130, which can slow the multiplexing. Accordingly, it may also be important for these mux-friendly circuits to quickly recover from a transient 130 (i.e., to be fast-settling).

While a chopper-stabilized amplifier can offer advantages to the multiplexed measurement system 100, it can be more difficult to make mux-friendly than other amplifier types due to its two-path (i.e., dual path) circuit topology. This technical problem may be made even worse when the chopper-stabilized amplifier is expected to operate in a high-voltage domain, in which a range of possible input voltages may be quite large (e.g., >10V), which may demand the implementation of an input circuit protection.

The present disclosure describes a chopper-stabilized amplifier circuit that is mux-friendly and high-voltage. In particular, the disclosed chopper-stabilized amplifier includes mux-friendly interface circuits (i.e., mux-interface circuits) to protect the amplifier from damage from transients, prevent the amplifier from loading measurements (i.e., preventing an in-rush of input current from transients), shorten a response time of the amplifier to transients, and allow the amplifier to operate at high-voltages (i.e., over a large range of voltages). In other words, the disclosed chopper-stabilized amplifier is made mux friendly by a plurality of mux-friendly interface circuits (e.g., dual mux-friendly interface circuits) and settling enhancer circuit.

Figure 2:
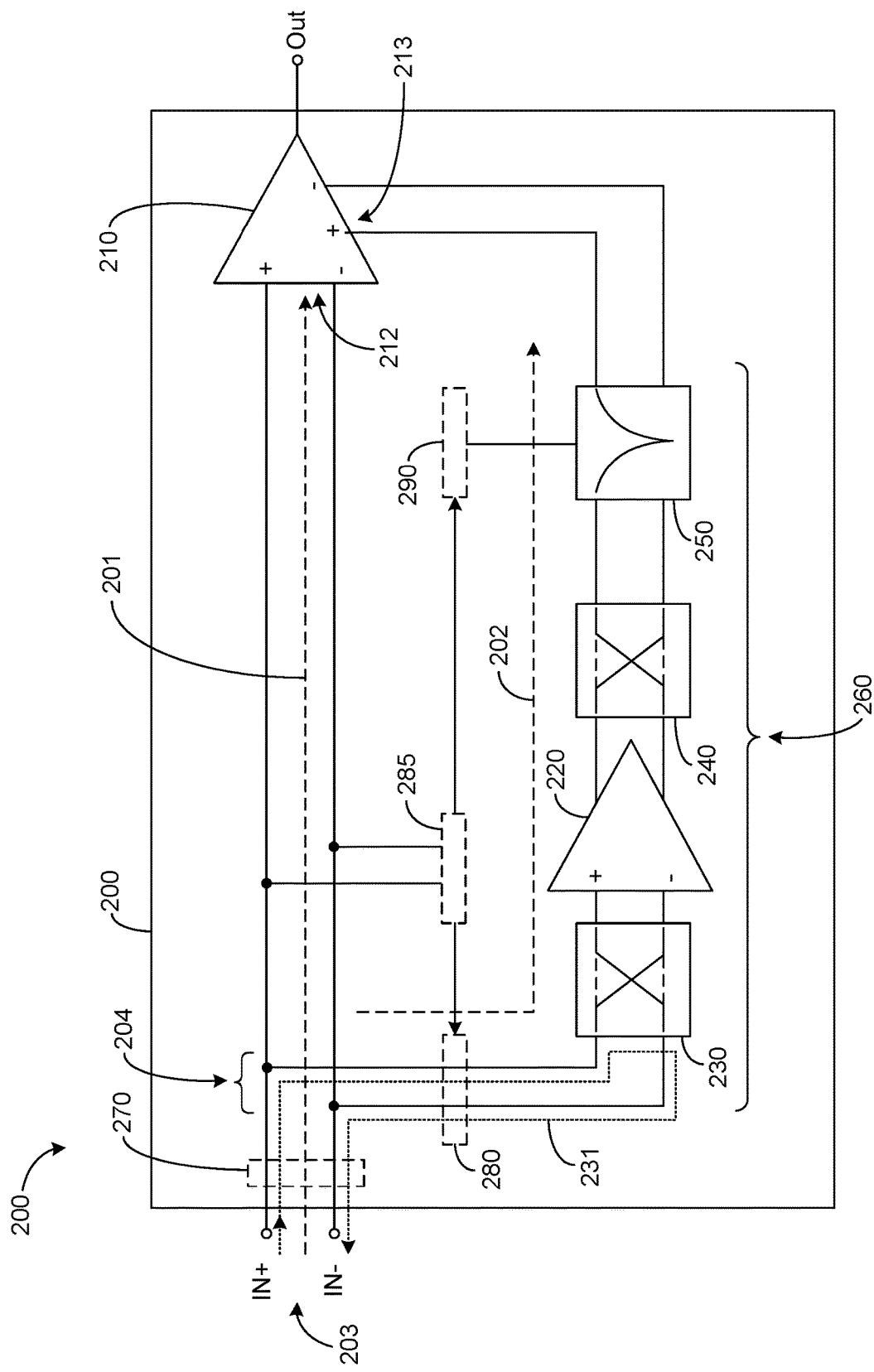
FIG. 2 is a block diagram of a chopper-stabilized amplifier according to a possible implementation of the present disclosure.

FIG. 2 illustrates a block diagram of a chopper-stabilized amplifier according to an implementation of the present disclosure. The chopper-stabilized amplifier 200 is configured to receive an input signal at an input 203 that includes a positive input terminal (IN+) and a negative input terminal (IN−). The input signal is split between a first path 201 (i.e., high-frequency path) and a second path 202 (i.e., low-frequency path) at a coupling node pair 204 on the first path 201. The first path 201 is between the input 203 of the chopper-stabilized amplifier 200 and a primary input 212 of a main amplifier 210 (e.g., main opamp). The main amplifier 210 has a non-ideal (i.e., non-zero) input offset voltage (VOS) (i.e., offset voltage) between a positive input terminal (+) and a negative input terminal (−) of its primary input 212.

The input offset voltage (VOS) can be compensated for (i.e., canceled, removed) by a compensation signal at an auxiliary input 213 of the main amplifier 210. The compensation signal is based on an offset voltage measurement made using a chopper amplifier circuit 260 in the second path 202 of the chopper-stabilized amplifier 200 between a coupling node pair 204 and the auxiliary input 213 of the main amplifier 210.

The chopper amplifier circuit 260 includes a null amplifier 220 (e.g., null opamp) that is coupled after a first chopper 230. The first chopper 230 is configured to modulate the input signal to a chopping frequency, while the null amplifier 220 is configured to amplify the chopped (i.e., modulated) signal. The null amplifier 220 has an offset voltage (VOS) that substantially matches the offset voltage of the main amplifier 210. The offset voltage of the null amplifier 220 is added after the signal is chopped (i.e., modulated) by the first chopper 230.

The chopper amplifier circuit 260 further includes a second chopper 240 coupled to the output of the null amplifier 220. The second chopper 240 is configured to demodulate the input signal that was modulated by the first chopper 230. The second chopper 240 is further configured to modulate the offset voltage which was added by the null amplifier 220 (i.e., after the first chopper 230). In other words, the offset voltage is not modulated by the first chopper 230, while the input signal is modulated by the first chopper 230. Accordingly, after the second chopper 240, the input signal and the offset voltage of the null amplifier 220 are at different frequencies, which can be separated by filtering.

The chopper amplifier circuit 260 further includes a notch filter 250 (e.g., RC notch filter) that can filter the output of the second chopper 240 to generate the compensation signal corresponding to the offset voltage (VOS). The main amplifier 210 receives the compensation signal at the auxiliary input 213. The compensation signal from the second path 202 can cancel the offset voltage (VOS) and reduce noise (e.g., 1/f noise) of the main amplifier 210. The compensation signal at the auxiliary input 213 makes an output (OUT) of the main amplifier 210 more accurate and less noisy (i.e., more stable) than it would be without the chopper amplifier circuit 260.

Without additional circuitry, a transient at the input 203 could damage the main amplifier 210 because while high-voltage transistors of the main amplifier 210 may have a high breakdown voltage from drain-to-source, their gate-to-source breakdown voltage may be relatively low. To prevent damage of the main amplifier 210 by a transient at the input 203, the disclosed chopper-stabilized amplifier 200 can include a first mux-friendly interface circuit 270 (i.e., first mux-interface circuit) in the first path 201 between the input 203 and the main amplifier 210. More specifically, the first mux-friendly interface circuit 270 can be positioned on the first path 201 between the input 203 and the coupling node pair 204 of the second path 202. The first mux-friendly interface circuit 270 may be configured to limit a differential voltage (e.g., +6V) at the primary input 212 (i.e., on the first path 201) without increasing the in-rush input current at the input 203. In other words, the first mux-interface circuit may be configured to limit an input voltage of an input signal at the input 203 without increasing the input current of the input signal at the input 203.

While the first mux-friendly interface circuit 270 can protect the main amplifier 210 by limiting a voltage (and current) in the first path 201, a transient can still appear after the first mux-friendly interface circuit 270 on the first path 201. While this transient may not damage the main amplifier 210, it can still generate an in-rush of input current that can reduce the apparent input resistance of the chopper-stabilized amplifier 200. This in-rush of input current may follow a low-impedance path 231 (e.g., low-resistance path) created by the chopper amplifier circuit 260. In particular the low-impedance path 231 may be generated by the first chopper 230.

To prevent the in-rush of input current during a slew condition, the disclosed chopper-stabilized amplifier further includes a second mux-friendly interface circuit 280 (i.e., second mux-interface circuit) in the second path 202 before the first chopper 230. When activated, the second mux-friendly interface circuit 280 can substantially block current flowing to the chopper amplifier circuit 260.

The second mux-friendly interface circuit 280 may be activated (i.e., triggered) in response to a slew condition in the first path 201 (after the first mux-friendly interface circuit 270). While active, the second mux-friendly interface circuit 280 can decouple the chopper amplifier circuit 260 from the input signal so that the low-impedance path 231 does not draw current. In other words, the second mux-interface circuit 280 can prevent the low-impedance path 231 from loading the input signal (i.e., measurement) during a slew condition. The second mux-friendly interface circuit 280 may remain active while the slew condition persists and may be deactivated when the transient condition ends. While deactivated, the second mux-friendly interface circuit 280 can couple the chopper amplifier circuit 260 to receive the input signal. In other words, when deactivated the second path 202 is restored so that the compensation signal can be generated by the chopper amplifier circuit 260 and transmitted to the auxiliary input 213. It should be noted that the terms "activated" and "deactivated" used above are relative terms related to modes of operation and are not intended to limit the implementation of the second mux-friendly interface circuit 280 to any particular electrical condition.

When a slew condition ends, it may be important to bring the chopper amplifier circuit 260 back online as quickly as possible. For example, in a multiplexed measurement system 100, the multiplexer can cycle through measurements at a relatively high rate. As a result, a relatively slow response (i.e., as compared to the cycling rate) of the chopper amplifier circuit 260 can reduce the precision of the chopper-stabilized amplifier 200, which can correspond to measurement errors. The present disclosure addresses this technical problem with a settling-enhancer circuit 290 that can fix voltages in the chopper amplifier circuit 260 at a level during a slew condition so that when the slew condition ends, the voltages are closer to their non-slew condition levels. In other words, the settling-enhancer circuit 290 can help to stabilize the compensation signal in response to transients.

Figure 3:
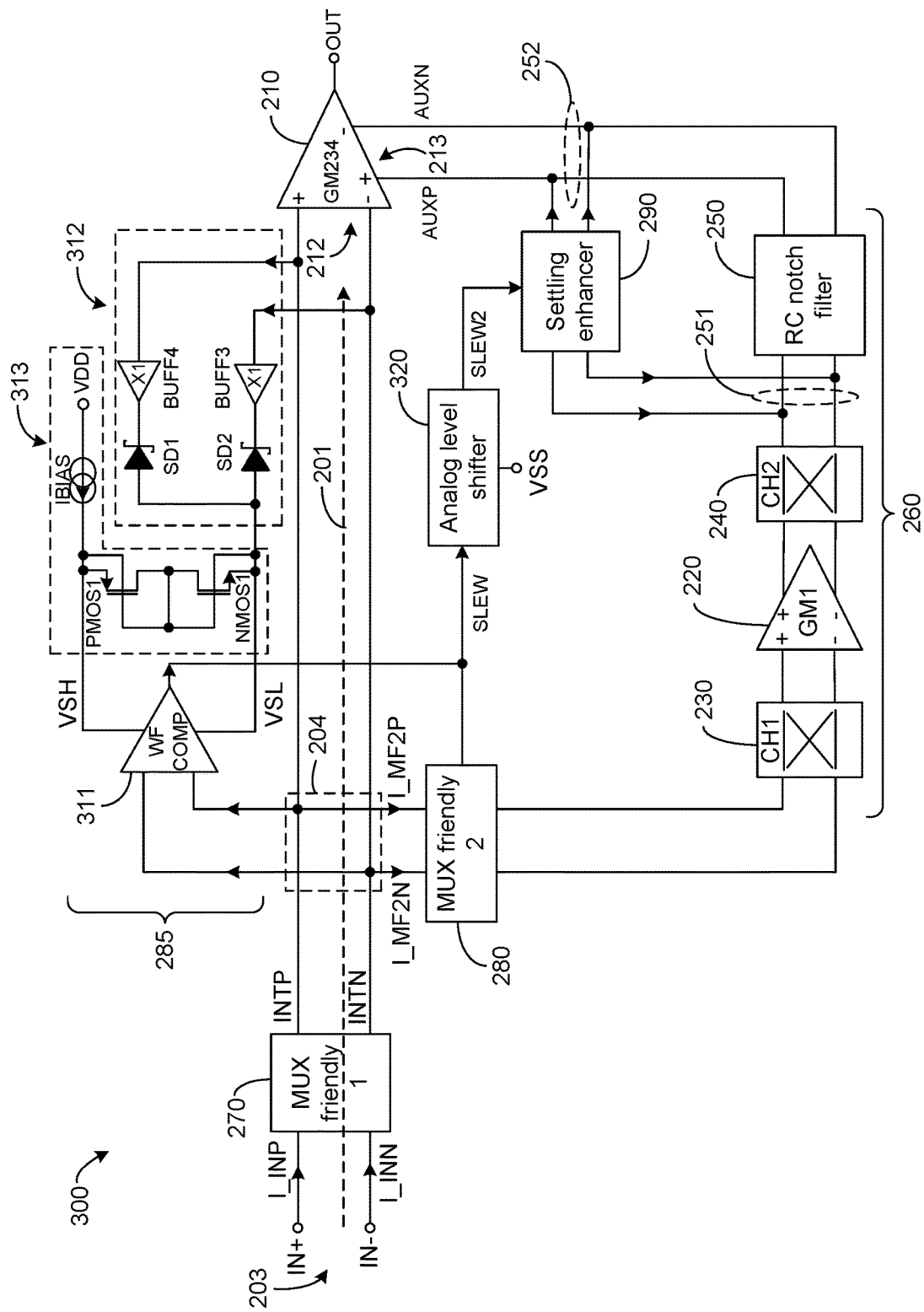
FIG. 3 is a detailed schematic block diagram of a chopper-stabilized amplifier according to a possible implementation of the present disclosure.

FIG. 3 is a detailed schematic block diagram of a chopper-stabilized amplifier according to a possible implementation of the present disclosure. As shown, the chopper-stabilized amplifier 300 includes a first mux-friendly interface circuit 270 configured to receive a measurement at an input 203. In other words, the first mux-friendly interface circuit 270 may be configured to receive an input signal between a positive terminal (IN+) and a negative terminal (IN−) of the input 203 of the chopper-stabilized amplifier. The first mux-friendly interface circuit 270 may be further configured to output an inner input signal to the primary input 212 along a first path 201. The inner input signal on the first path 201 may include a positive inner node voltage (VINTP) at a positive inner node (INTP) and a negative inner node voltage (VINTP at a negative inner node (INTN). The input signal may float according to a common-mode voltage (e.g., VCM=(VINTP+VINTN)/2), which can have values between VSS (the negative supply rail) and VDD−1.5V; VDD being the positive supply rail.

A differential voltage (e.g., VINTP-VINTN) on the first path 201 may be relatively small (e.g., <+50 mV) in a non-slew condition and relatively large (e.g., >±50 mV) in a slew condition. Accordingly, a slew condition may be detected by determining when the differential voltage of the primary input signal 212 exceeds a window voltage range (i.e., window voltage) As a result, the slew-detector circuit 285 can include a window floating comparator 311 configured to compare the difference between the positive inner node voltage (VINTP) and the negative inner node voltage (VINTN) with a chosen domain of (e.g., +50 mV).

The window floating comparator 311 may be configured to output a slew signal (SLEW) corresponding to the slew condition based on the comparison of the inner input signal of the first path 201 to the (voltage) window. The slew signal (SLEW) may be a two-level signal. For example, the slew signal (SLEW) may be at a first level, VSL, (e.g., relatively low voltage, equal with VCM in normal operation and lower than VCM in slew condition) when the input signal is outside the window (i.e., slew condition) and a second level, VSH, (e.g., relatively high voltage, higher than VSL with approximately 1.5V) indicating that the input signal is inside the window (i.e., non-slew condition, normal condition). For example, a LOW slew signal may indicate a slew condition while a HIGH slew signal may indicate a non-slew condition (i.e., normal operation), but this is not a requirement. The circuit may be implemented with different slew signal detection schemes as long as the two conditions can be sensed.

The supply of the window floating comparator 311 may be set by a floating-supply circuit 313 that receives a floating voltage from a minimum voltage selector circuit 312. The minimum voltage selector circuit 312 can be configured to output a voltage based on the positive inner node voltage (VINTP) and the negative inner node voltage (VINTN) of the first path 201. For example, the minimum voltage selector circuit 312 can output a voltage based on the lower of the positive inner node voltage (VINTP) and the negative inner node voltage (VINTN) (i.e., MIN(VINTP, VINTN)) as the lower supply rail (VSL) for the window floating comparator 311.

As shown, the minimum voltage selector 312 is coupled to the first path 201 to receive the positive inner node voltage (VINTP) and the negative inner node voltage (VINTN). The positive inner voltage is coupled to a cathode of a first Schottky diode (SD1) via a first buffer. The negative inner node voltage (VINTN) is coupled to a cathode of a second Schottky diode (SD2) via a second buffer. The first and second buffers can help to prevent the minimum voltage selector circuit 312 from loading the first path 201. The anode of the first Schottky diode (SD1) and the anode of the second Schottky diode (SD2) are coupled together so that the lower of the positive inner node voltage (VINTP) and the negative inner node voltage (VINTN) appears at an output of the minimum voltage selector circuit 312 augmented with the voltage drop on a Schottky diode (e.g., 0.1 V). In other words, the minimum voltage selector circuit 312 is configured to sense the common-mode voltage of the input signal and to output a voltage very close to this common-mode voltage to the floating-supply circuit 313 during normal operation of the circuit (i.e., outside slew condition), when VINTP and VINTP are close. During slew-condition, minimum voltage selector circuit 312 outputs a voltage very close (with 0.1 V higher) to the minimum between VINTP and VINTP.

The floating-supply circuit 313 is configured to receive the common-mode voltage at an input (in normal operation) as a lower voltage and to generate an upper voltage relative to the lower voltage. As shown, the floating-supply circuit 313 can include a pair of diode-connected transistors (PMOS1, NMOS1). The diode-connected transistors may generate the upper voltage when they are biased by a current (IBIAS) supplied from the positive supply rail (VDD). While two diodes could be used, diode-connected metal oxide semiconductor (MOS) transistors may have better (e.g., more stable) thermal performance. The floating-supply circuit 313 may output the upper voltage (VSH) and the lower voltage (VSL) to the window floating comparator 311.

The slew signal (SLEW) output by the window floating comparator 311 may be coupled to the second mux-interface circuit 280 and the settling-enhancer circuit 290 so that these circuits can be activated during a slew condition and deactivated in a non-slew condition (i.e., normal operation). The slew signal may be level shifted by an analog-level shifter 320 in order to control the settling-enhancer circuit 290. The analog-level shifter 320 may be configured to convert the slew signal from a floating voltage domain (e.g., VSL to VSH) (i.e., floating supply) to a fixed voltage domain (e.g., referred to VSS). For example, the analog-level shifter may output a second slew signal (SLEW2) that is at a first level (e.g., relatively high voltage) when the input signal is outside the window (i.e., slew condition) and a second level (e.g., relatively low voltage) indicating that the input signal is inside the window (i.e., non-slew condition, normal condition), where the first level and the second level of the second slew signal (SLEW2) are shifted from the first level and the second level of first slew signal (SLEW). This level shifting may be required because the chopper amplifier circuit 260 operates in the low-voltage domain (e.g., 0 to 4 V).

The settling-enhancer circuit 290 is coupled to (i) an input 251 of the notch filter 250 (e.g., RC notch filter) and (ii) and output 252 of the notch filter 250. The settling-enhancer circuit 290 may be triggered by the second slew signal (SLEW2) to hold the input 251 and the output 252 for the notch filter 250 at a fixed voltage (VREF) during a slew condition. One possible reason for this is the long recovery time of the chopper amplifier circuit 260 after a slew condition. Without the settling-enhancer circuit 290 the notch filter 250 may become discharged while the chopper amplifier circuit 260 is decoupled from the input by the second mux-interface circuit 280. Upon being recoupled to the input by the second mux-interface circuit 280, the null amplifier 220 can recharge the notch filter 250 but this recharging may be slowed by the chopper amplifier's inability to supply a large current. Accordingly, the settling-enhancer circuit 290 can reduce the amount of recharging necessary after recoupling, which can accelerate (i.e., enhance) the recovery (i.e., settling) back to normal operation. As a result, the settling-enhancer circuit 290 can improve an overall speed of the chopper-stabilized amplifier 300.

Figure 4:
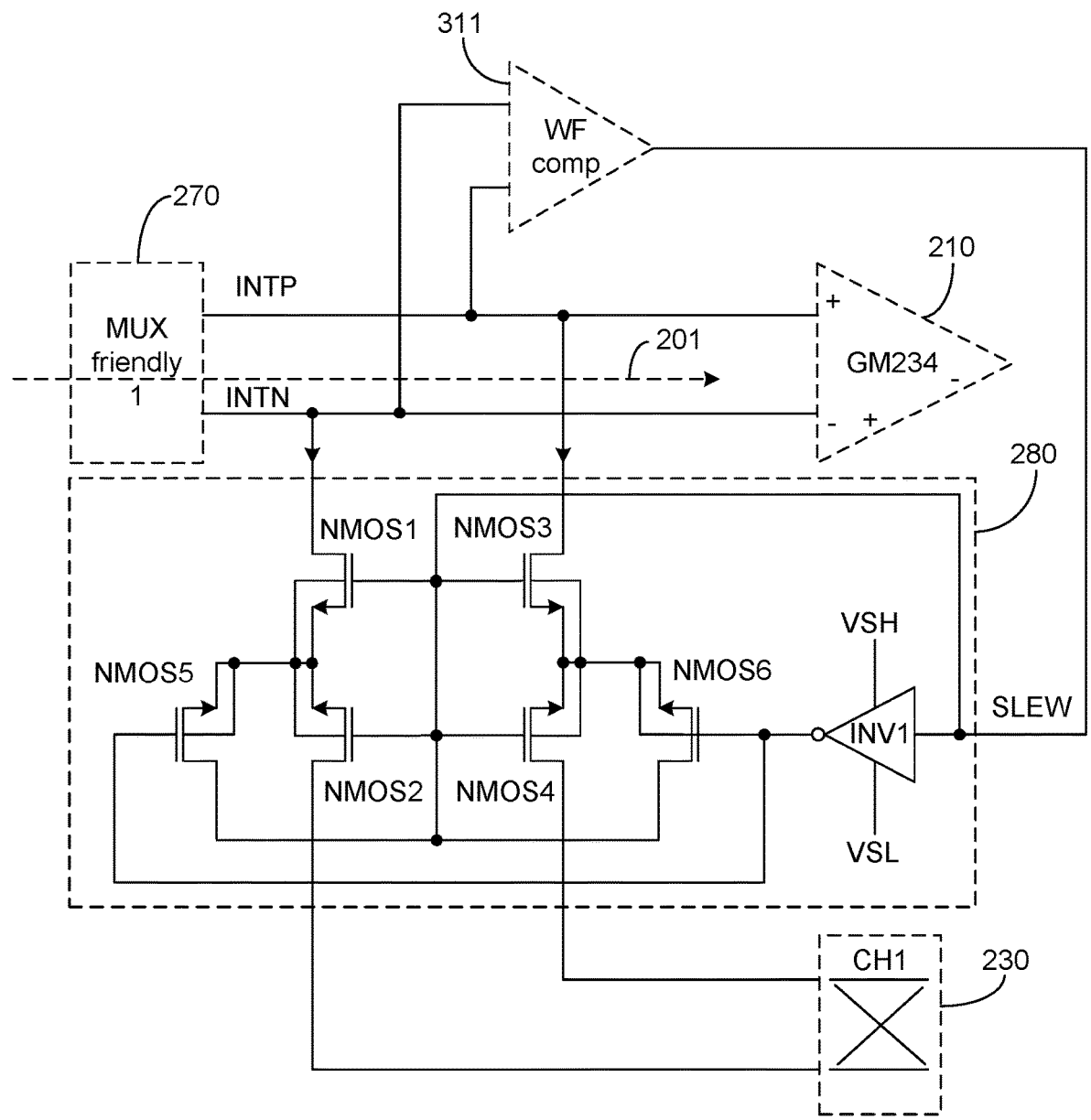
FIG. 4 is a schematic of a second mux-friendly circuit for the chopper-stabilized amplifier of FIG. 3 according to a possible implementation of the present disclosure.

FIG. 4 is a detailed schematic of the second mux-friendly interface circuit 280 according to a possible implementation of the chopper-stabilized amplifier 300. As shown, the second mux-friendly interface circuit 280 includes a first pair of isolated NMOS transistors (NMOS1, NMOS2) and a second pair of isolated NMOS transistors (NMOS3, NMOS4). Each pair is configured to function as a bi-directional switch. The bi-directional characteristic of a first switch formed by the first pair of transistors (NMOS1, NMOS2) and a second switch formed by the second pair of transistors (NMOS3, NMOS4) may enable switching transients having positive or negative polarity. For example, a transient having a positive polarity may have a positive voltage between a positive inner node (INTP) (i.e., positive inner input) and a negative inner node (INTN) (i.e., negative inner input) of the first path 201, while a transient having a negative polarity may have a negative voltage between the positive inner node (INTP) and the negative inner node (INTN) of the first path 201.

The first pair of isolated NMOS transistors (NMOS1, NMOS2) can be turned ON (conducting) or OFF (blocking) to connect or disconnect a negative inner input (INTN) of the first path 201 to a negative input of the first chopper 230. Likewise, the second pair of isolated NMOS transistors (NMOS3, NMOS4) can be turned ON (conducting) or OFF (blocking) to connect or disconnect the positive inner input (INTP) of the first path 201 to a positive input of the first chopper 230. For example, a LOW slew signal (SLEW) may configure the pairs of transistors to decouple the first chopper 230 from the first path 201 (i.e., during a slew condition), while a HIGH slew signal (SLEW) may configure the pairs of transistors to couple the first chopper 230 to the first path 201 (i.e., in normal operation).

In a possible implementation, the second mux-interface circuit 280 may further include two additional transistors (NMOS5, NMOS6) to increase a speed of switching in response to a transient. For example, an inverted (i.e., see inverter (INV1)) slew signal (SLEW) may configure the additional pair of transistors (NMOS5, NMOS6) to turn ON (i.e., conducting) while the pairs of transistors (NMOS1, NMOS2, NMOS3, NMOS4) are turned OFF (i.e., blocking) during a slew condition. The additional pair of transistors in the ON state can drain a gate-to-source capacitance of the first pair of isolated NMOS transistors (NMOS1, NMOS2) and the second pair of isolated NMOS transistors (NMOS3, NMOS4). This additional charge draining function may be important when the pairs of transistors (NMOS1, NMOS2, NMOS3, NMOS4) are relatively large (e.g., to improve noise performance) and have a relatively large gate-to-source capacitance that is charged in an ON condition. Draining this gate-to-source capacitance can help to increase a speed that the pairs of transistors (NMOS1, NMOS2, NMOS3, NMOS4) can be turned OFF in response to a transient.

The pairs of transistors (NMOS1, NMOS2, NMOS3, NMOS4) may be the same size, and the pairs of transistors (NMOS1, NMOS2, NMOS3, NMOS4) may be larger than the additional pair of transistors (NMOS5, NMOS6). The first pair of NMOS transistors (NMOS1, NMOS2) may be isolated, meaning that they are fabricated within separate wells on a substrate. As a result, the first pair of NMOS transistors may have their back-gates (i.e., body terminals) coupled together so that their threshold voltages are fixed at the same level (e.g., minimum level). Likewise, the second pair of NMOS transistors may have their back-gates (i.e., body terminals) coupled together so that their threshold voltages are fixed at the same level.

Figure 5:
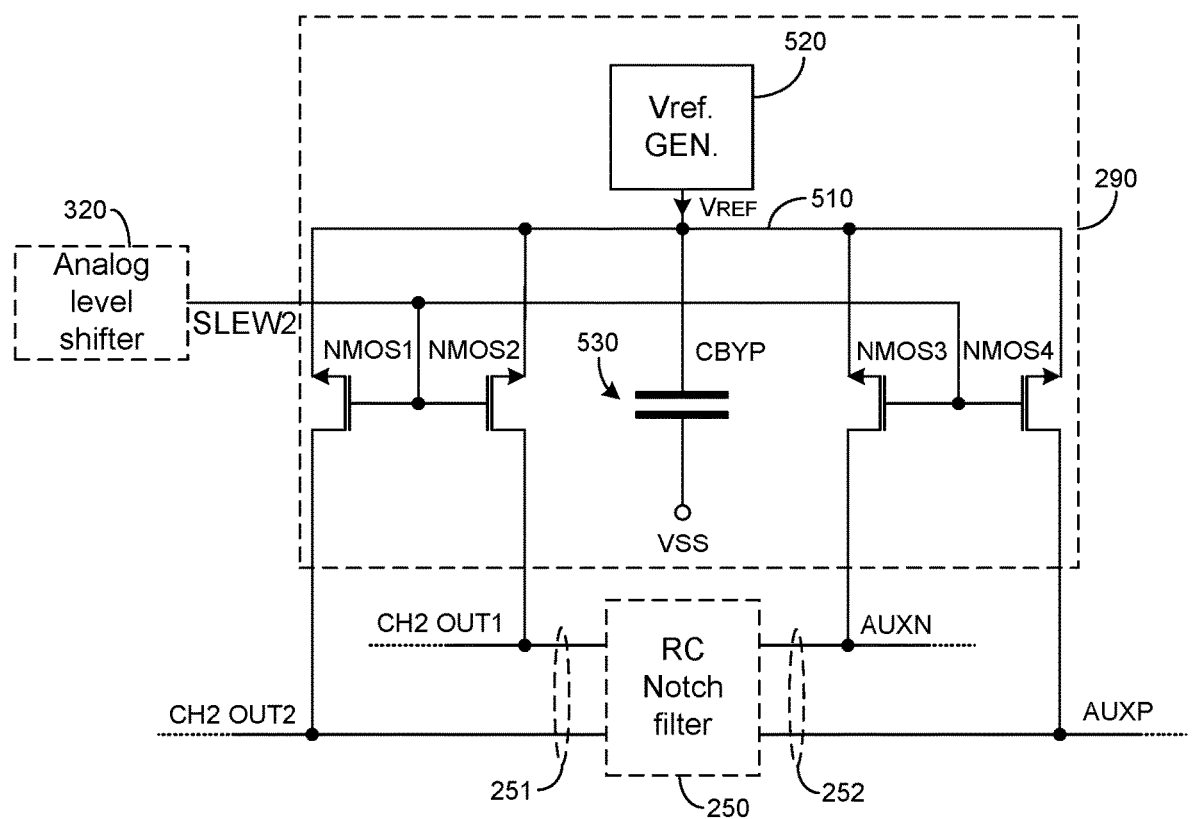
FIG. 5 is a schematic of a settling-enhancer circuit for the chopper-stabilized amplifier of FIG. 3 according to a possible implementation of the present disclosure.

FIG. 5 is a detailed schematic of the settling-enhancer circuit 290 according to a possible implementation of the chopper-stabilized amplifier 300. As shown, an input 251 to the notch filter 250 (e.g., RC notch filter) may include a positive terminal (CH2 OUT1) and a negative terminal (CH2 OUT2), while the output 252 may include negative terminal (AUXN) and positive terminal (AUXP). The negative terminal (CH2 OUT2) of the input 251 can be connected to a rail 510 by a first transistor (NMOS1) of the settling-enhancer circuit 290 and the positive terminal (CH2 OUT1) of the input 251 can be connected to the rail 510 by a second transistor (NMOS2). Likewise, the negative terminal (AUXN) of the output 252 can be connected to the rail 510 by a third transistor (NMOS3) of the settling-enhancer circuit 290 and the positive terminal (AUXP) of the output 252 can be connected to the rail 510 by a fourth transistor (NMOS4). The first transistor (NMOS1), the second transistor (NMOS2), the third transistor (NMOS3), and the fourth transistor (NMOS4) may be coupled at respective gate terminals to an output of the analog-level shifter 320. A level-shifted slew signal (SLEW2) can control the transistors to couple the input 251 and the output 252 to the rail 510. For example, the level-shifted slew signal (SLEW2) can turn the transistors ON (i.e., conducting) during a slew condition and OFF (i.e., not conducting) during a non-slew condition (i.e., normal operation). In other words, voltages at the input 251 and the output 252 may be prevented from changing during the slew condition because they are connected to the rail 510.

The rail 510 receives a reference voltage (VREF) from a voltage generator 520 (i.e., voltage source). As shown, the transistors (NMOS1, NMOS2, NMOS3, NMOS4) do not require back gate connections (i.e., have three terminals instead of four) because isolation may not be required due to the low voltage domain created by the null amplifier 220 and the analog-level shifter 320.

The settling-enhancer circuit 290 can further include a bypass capacitor 530 (CBYP) coupled between the rail 510 and a negative supply rail (VSS). The bypass capacitor 530 can help the voltage generator 520 supply current to the rail 510 and can reduce variations of the reference voltage (VREF) at the rail 510. The rail may be at a small voltage (e.g., 1.5 V) above the negative supply rail (VSS).

Figure 6:
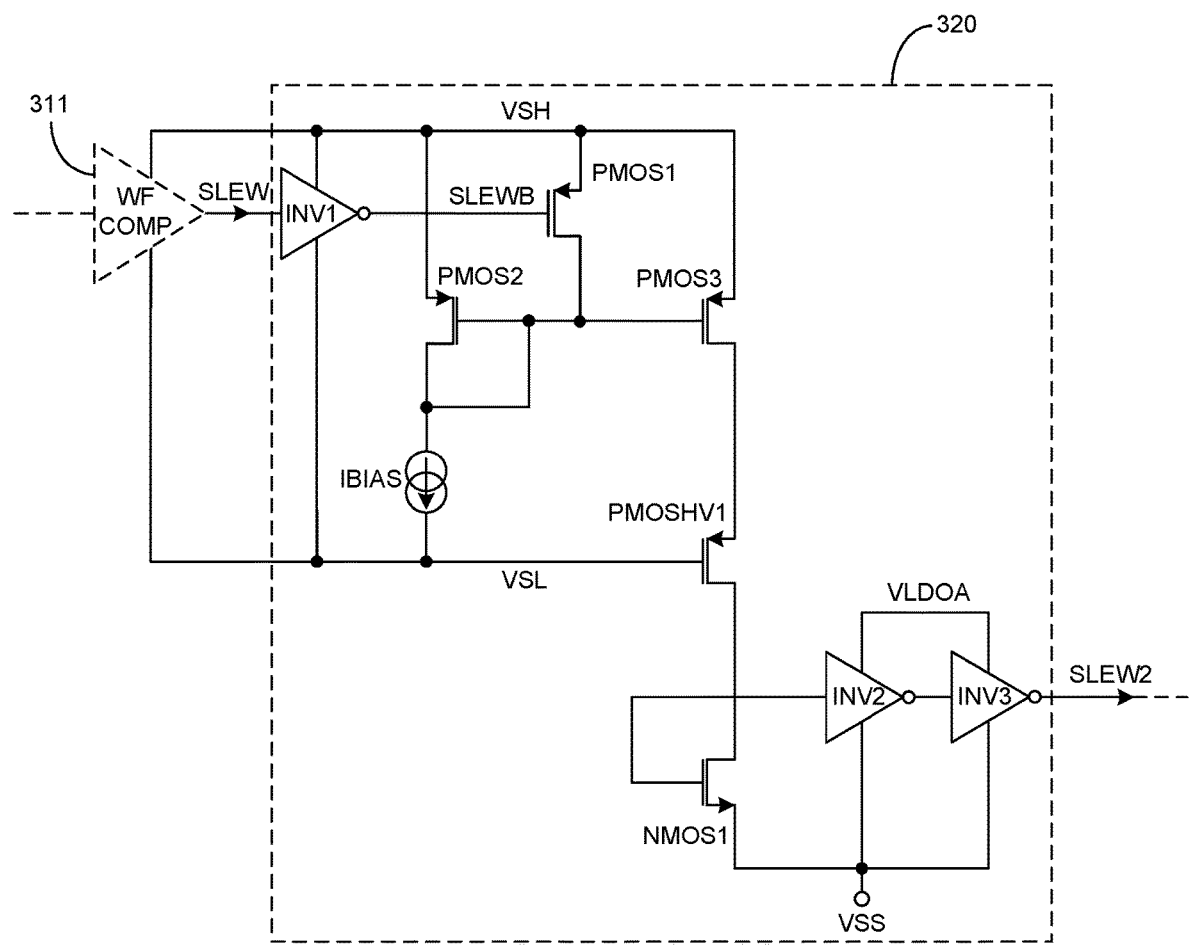
FIG. 6 is a schematic of an analog-level shifter for the chopper-stabilized amplifier of FIG. 3 according to a possible implementation of the present disclosure.

FIG. 6 is a detailed schematic of the analog-level shifter 320 according to a possible implementation of the chopper-stabilized amplifier 300. The analog-level shifter is configured to convert the first slew signal (i.e., slew signal) from the window floating comparator 311 from a floating voltage domain (VSH, VSL) to a fixed voltage domain (VLDOA, VSS). As shown, the analog-level shifter 320 includes a current source (IBIAS). The current source can be activated or deactivated by the slew signal (SLEW), which controls an ON/OFF state of a first PMOS transistor (PMOS1). For example, a LOW slew signal (SLEW) may be inverted by a first inverter (INV1) to cause the first PMOS transistor to cut off (i.e., turn OFF), which effectively allows the current from the current source (IBIAS) to flow through the current mirror (PMOS2, PMOS3) and a cascode transistor (PMOSHV1). The flowing current can bias a diode-connected output transistor (NMOS1), which creates a voltage that can be buffered by two inverters (INV2, INV3) to become a HIGH second slew signal (SLEW2) in the fixed voltage domain (VLDOA, VSS). In other words, the first slew signal and the second slew signal may indicate a slew condition at different levels. For example, the first slew signal (SLEW) may be active LOW, while the second slew signal (SLEW2) may be active HIGH.

Figure 7:
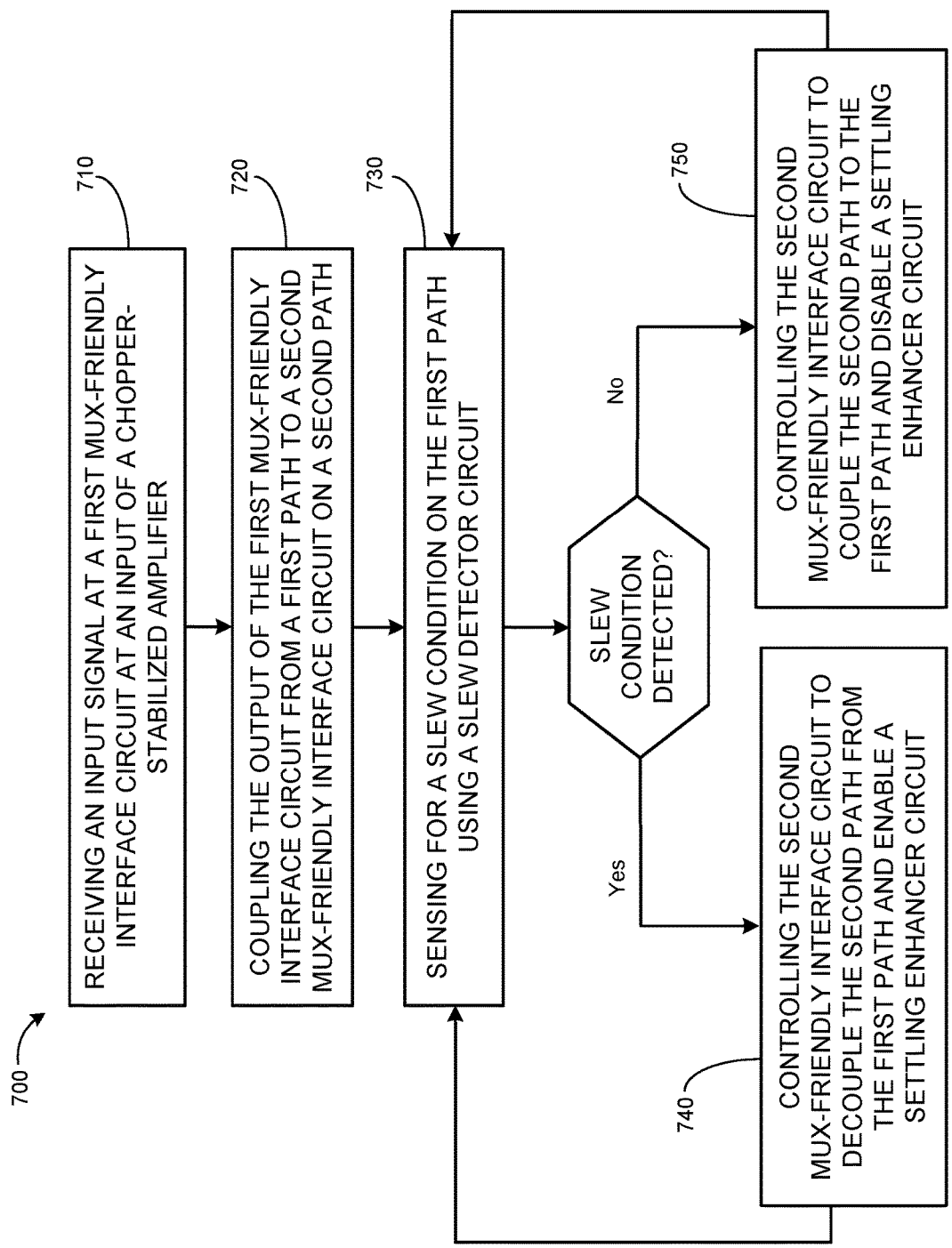
FIG. 7 is a method to reduce an in-rush of current at the input to a chopper-stabilized amplifier during a slew condition according to a possible implementation of the present disclosure.

FIG. 7 is a method to reduce an in-rush of input current to a chopper-stabilized amplifier during a slew condition according to a possible implementation of the present disclosure. The method 700 includes receiving 710 an input signal at first mux-friendly interface circuit 270 at an input 203 of a chopper-stabilized amplifier 300. The method 700 further includes coupling 720 an output of the first mux-friendly interface circuit 270 from a first path 201 (i.e., leading to a primary input 212 of the main amplifier 210) to a second mux-friendly interface circuit 280 on a second path 202 (i.e., leading to an auxiliary input 213 of the main amplifier 210). The method 700 further includes sensing 730 for a transient (i.e., slew condition) on the first path 201 using a slew-detector circuit 285. If slew condition is detected, the method 700 includes controlling 740 the second mux-friendly interface circuit 280 (e.g., with a slew signal from the slew-detector circuit 285) to decouple the second path 202 from the first path 201 (e.g., during the slew condition). If a slew condition is not detected, the method 700 includes controlling 750 the second mux-friendly interface circuit 280 (e.g., with the slew signal from the slew-detector circuit 285) to couple (recouple) the second path 202 to the first path 201 (e.g., while non-slew condition).

In the following, some examples of the disclosure are described.

Example 1. A chopper-stabilized amplifier comprising: a main amplifier 210 including a primary input 212 configured to receive an inner input signal from a first path 201 and an auxiliary input 213 configured to receive a compensation signal from a second path 202; a first mux-interface circuit 270 in the first path 201 configured to limit the inner input signal received at the primary input 212 of the main amplifier 210; a chopper amplifier circuit 260 in the second path 202 configured to receive the inner input signal from the first path 201 and to output the compensation signal to the auxiliary input 213; a second mux-interface circuit 280 in the second path 202 configured to couple and decouple the chopper amplifier circuit 260 to and from the first path 201; and a slew-detector circuit 285 coupled to the first path 201 and configured to: detect that the inner input signal is in a slew condition; and transmit, in response to the detection, a slew signal to configure the second mux-interface circuit 280 to decouple the second path 202 from the first path 201 while the inner input signal is in the slew condition.

Example 2. The chopper-stabilized amplifier according to example 1, wherein the first mux-interface circuit 270 is configured to: receive an input signal at an input 203 to the chopper-stabilized amplifier and output the inner input signal to the primary input 212 of the main amplifier 210; and limit an input voltage of the input signal without increasing an input current at the input 203

Example 3. The chopper-stabilized amplifier according to example 2, wherein the input signal received at the input 203 is in a high-voltage domain.

Example 4. The chopper-stabilized amplifier according to any of the preceding examples, wherein the second mux-interface circuit 280 blocks a low-impedance path 231 between an inner input of the chopper-stabilized amplifier and the chopper amplifier circuit 260 while the inner input signal is in the slew condition.

Example 5. The chopper-stabilized amplifier according to any of the preceding examples, wherein the slew-detector circuit 285 is configured to: output a slew signal (SLEW) at a first level when the inner input signal is outside a window of a window floating comparator 311, the first level indicating the slew condition, wherein the slew signal at the first level controls the second mux-interface circuit 280 to decouple the chopper amplifier circuit 260 from the first path 201; and output the slew signal (SLEW) at a second level when the inner input signal is within the window of the window floating comparator 311, the second level indicating a non-slew condition, wherein the slew signal at the second level controls the second mux-interface circuit 280 to couple the chopper amplifier circuit 260 to the first path 201.

Example 6. The chopper-stabilized amplifier according to example 5, wherein the slew-detector circuit 285 is configured to: sense a positive inner node voltage (VINTP) and a negative inner node voltage (VINTN) of the inner input signal to generate a lower-supply voltage (VSL) of the window floating comparator 311, the first level being the lower-supply voltage (VSL); and generate a higher-supply voltage (VSH) relative to the lower-supply voltage (VSL) so that the higher-supply voltage (VSH) is greater than the lower-supply voltage (VSL) by a fixed voltage, the second level being the higher-supply voltage (VSH).

Example 7. The chopper-stabilized amplifier according to example 6, wherein the lower-supply voltage (VSL) is a minimum voltage of the positive inner node voltage (VINTP) and the negative inner node voltage (VINTN) of the inner input signal.

Example 8. The chopper-stabilized amplifier according to any of the preceding examples, wherein the chopper amplifier circuit 260 includes: a first chopper 230 coupled to the second mux-interface circuit 280, the first chopper 230 configured to receive the inner input signal and to output a modulated signal; a null amplifier 220 coupled to the first chopper 230, the null amplifier 220 configured to receive the modulated signal and to output an amplified-modulated signal; a second chopper 240 coupled to the null amplifier 220, the second chopper 240 configured to receive the amplified-modulated signal and output a demodulated signal; and a notch filter 250 coupled to the second chopper 240, the notch filter 250 configured to receive the demodulated signal and to output a filtered demodulated signal as the compensation signal.

Example 9. The chopper-stabilized amplifier according to example 8, wherein the second mux-interface circuit 280 blocks an input current from being conducted by the first chopper 230 while the inner input signal is in the slew condition.

Example 10. The chopper-stabilized amplifier according to any of the preceding examples, wherein the slew-detector circuit 285 includes: a minimum voltage selector circuit 312 coupled to the first path 201, the minimum voltage selector circuit 312 configured to: receive the inner input signal from the first path 201; and output a lower-supply voltage (VSL) based on a minimum of a positive inner node voltage (VINTP) and a negative inner node voltage (VINTN) of the inner input signal; a floating-supply circuit 313 coupled to the minimum voltage selector circuit 312, the floating-supply circuit 313 configured to: generate a higher-supply voltage (VSH) at a fixed voltage above the lower-supply voltage (VSL); and output the higher-supply voltage (VSH) and the lower-supply voltage (VSL); and a window floating comparator 311 coupled to the floating-supply circuit 313 and the first path 201, the window floating comparator 311 configured to: compare the inner input signal from the first path 201 to a voltage window; and output a slew signal based on the comparison, the slew signal controlling the second mux-interface circuit 280.

Example 11. The chopper-stabilized amplifier according to example 10, wherein the minimum voltage selector circuit 312 includes: a first Schottky diode coupled at a first cathode to a positive inner voltage (VINTP) of the first path 201; and a second Schottky diode coupled at a second cathode to a negative inner voltage (VINTN) of the first path 201, a first anode of the first Schottky diode coupled to a second anode of the second Schottky diode to output a lower supply voltage (VSL) based on a minimum of the positive inner voltage (VINTP) and the negative inner voltage (VINTN).

Example 12. The chopper-stabilized amplifier according to any of the preceding examples, further including a settling-enhancer circuit 290 that is controlled by the slew-detector circuit 285, the settling-enhancer circuit 290 enabled by the slew-detector circuit 285 to prevent a voltage in the chopper amplifier circuit 260 from changing while the inner input signal is in the slew condition.

Example 13. The chopper-stabilized amplifier according to example 12, wherein the settling-enhancer circuit 290 is coupled to an input of a notch filter 250 of the chopper amplifier circuit 260 and to an output of the notch filter 250 of the chopper amplifier circuit 260, the settling-enhancer circuit 290 configured by a slew signal generated by the slew-detector circuit 285 to hold the input of the notch filter 250 and the output of the notch filter 250 at a reference voltage.

Example 14. The chopper-stabilized amplifier according to example 13, further including an analog-level shifter 320 coupled between the slew-detector circuit 285 and the settling-enhancer circuit 290, the analog-level shifter 320 configured to convert the slew signal from a floating voltage domain to a fixed voltage domain.

Example 15. A method to reduce an in-rush of input current to a chopper-stabilized amplifier 200 during a slew condition, the method comprising: receiving an input signal at an input 203 at a first mux-interface circuit 270, the first mux-interface circuit 270 configured to output an inner input signal to a first path 201 of the chopper-stabilized amplifier 200, the first path 201 between the input 203 and a primary input 212 of a main amplifier 210; coupling the inner input signal from the first path 201 to a second path 202 of the chopper-stabilized amplifier 200, the second path 202 between a coupling node pair 204 on the first path 201 and an auxiliary input 213 of the main amplifier 210; detecting a slew condition on the first path 201 using a slew-detector circuit 285; controlling, based on the slew condition, a second mux-interface circuit 280 positioned on the second path 202 between the coupling node pair 204 and a chopper amplifier circuit 260; and blocking, using the second mux-interface circuit 280, a low-impedance path 231 in the chopper amplifier circuit 260 to reduce the in-rush of input current to the chopper-stabilized amplifier 200 during the slew condition.

Example 16. The method according to example 15, further including: limiting an input voltage of the input signal on the first path 201, without increasing an input current of the input signal; using the first mux-interface circuit 270, the first mux-interface circuit 270 positioned on the first path 201 between the input 203 and the coupling node pair 204.

Example 17. The method according to examples 15 or 16, wherein detecting the slew condition on the first path 201 using the slew-detector circuit 285 includes: sensing a positive inner node voltage (VINTP) and a negative inner node voltage (VINTN) of the inner input signal on the first path 201; generating a lower-supply voltage (VSL) and a higher-supply voltage (VSH) to supply a window floating comparator 311 based on the positive inner node voltage (VINTP) and the negative inner node voltage (VINTN); and comparing the inner input signal to a voltage window of the window floating comparator 311 to output a slew signal corresponding to the slew condition.

Example 18. The method according to example 17, wherein sensing the positive inner node voltage (VINTP) and the negative inner node voltage (VINTN) includes: selecting a minimum of the positive inner node voltage (VINTP) and the negative inner node voltage (VINTN) of the first path 201.

Example 19. The method according to any of examples 15-18, further including: controlling, based on the slew condition, a settling-enhancer circuit 290 to prevent a voltage in the chopper amplifier circuit 260 from changing while the input signal is in the slew condition.

Example 20. The method according to any of examples 15-19, wherein the input signal at the input 203 is a measurement 110A from a multiplexer 101 in a high-voltage domain.

Example 21. A multiplexed measurement system comprising: a multiplexer 101 configured to couple a plurality of measurements to an output; and a chopper-stabilized amplifier 200 configured to receive an input signal from the output of the multiplexer 101, the chopper-stabilized amplifier 200 including: a first mux-friendly interface circuit 270 configured to receive the input signal and to output an inner input signal to a first path 201, the first mux-friendly interface circuit 270 further configured to limit an input voltage of the input signal without increasing an input current of the input signal; a main amplifier 210 including a primary input 212 configured to receive the inner input signal from the first path 201 and an auxiliary input 213 configured to receive a compensation signal from a second path 202; a chopper amplifier circuit 260 in the second path 202 configured to receive the inner input signal from the first path 201 and to output the compensation signal to the auxiliary input 213; a second mux-friendly interface circuit 280 in the second path 202 configured to couple and decouple the chopper amplifier circuit 260 to and from the first path 201; and a slew-detector circuit 285 coupled to the first path 201 and configured to detect that the inner input signal is in a slew condition and transmit, in response to the detection, a slew signal to configure the second mux-friendly interface circuit 280 to decouple the second path 202 from the first path 201 while the input signal is in the slew condition.

Example 22. The multiplexed measurement system according to example 21, wherein the second mux-friendly interface circuit 280 blocks a low-impedance path 231 between an input of the chopper-stabilized amplifier 200 and the chopper amplifier circuit 260 to reduce an in-rush of input current to the chopper-stabilized amplifier 200 during the slew condition.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

The invention claimed is:

1. A chopper-stabilized amplifier comprising:
a main amplifier including a primary input configured to receive an inner input signal from a first path and an auxiliary input configured to receive a compensation signal from a second path;
a first mux-interface circuit in the first path configured to limit the inner input signal received at the primary input of the main amplifier;
a chopper amplifier circuit in the second path configured to receive the inner input signal from the first path and to output the compensation signal to the auxiliary input;
a second mux-interface circuit in the second path configured to couple and decouple the chopper amplifier circuit to and from the first path; and
a slew-detector circuit coupled to the first path and configured to:
detect that the inner input signal is in a slew condition; and
transmit, in response to the detection, a slew signal to configure the second mux-interface circuit to decouple the second path from the first path while the inner input signal is in the slew condition.

2. The chopper-stabilized amplifier according to claim 1, wherein the first mux-interface circuit is configured to:
receive an input signal at an input to the chopper-stabilized amplifier and output the inner input signal to the primary input of the main amplifier; and
limit an input voltage of the input signal without increasing an input current at the input.

3. The chopper-stabilized amplifier according to claim 2, wherein the input signal received at the input is in a high-voltage domain.

4. The chopper-stabilized amplifier according to claim 1, wherein the second mux-interface circuit blocks a low-impedance path between an inner input of the chopper-stabilized amplifier and the chopper amplifier circuit while the inner input signal is in the slew condition.

5. The chopper-stabilized amplifier according to claim 1, wherein the slew-detector circuit is configured to:
output a slew signal (SLEW) at a first level when the inner input signal is outside a window of a window floating comparator, the first level indicating the slew condition, wherein the slew signal at the first level controls the second mux-interface circuit to decouple the chopper amplifier circuit from the first path; and
output the slew signal (SLEW) at a second level when the inner input signal is within the window of the window floating comparator, the second level indicating a non-slew condition, wherein the slew signal at the second level controls the second mux-interface circuit to couple the chopper amplifier circuit to the first path.

6. The chopper-stabilized amplifier according to claim 5, wherein the slew-detector circuit is configured to:
sense a positive inner node voltage (VINTP) and a negative inner node voltage (VINTN) of the inner input signal to generate a lower-supply voltage (VSL) of the window floating comparator, the first level being the lower-supply voltage (VSL); and
generate a higher-supply voltage (VSH) relative to the lower-supply voltage (VSL) so that the higher-supply voltage (VSH) is greater than the lower-supply voltage (VSL) by a fixed voltage, the second level being the higher-supply voltage (VSH).

7. The chopper-stabilized amplifier according to claim 6, wherein the lower-supply voltage (VSL) is a minimum voltage of the positive inner node voltage (VINTP) and the negative inner node voltage (VINTN) of the inner input signal.

8. The chopper-stabilized amplifier according to claim 1, wherein the chopper amplifier circuit includes:
a first chopper coupled to the second mux-interface circuit, the first chopper configured to receive the inner input signal and to output a modulated signal;
a null amplifier coupled to the first chopper, the null amplifier configured to receive the modulated signal and to output an amplified-modulated signal;
a second chopper coupled to the null amplifier, the second chopper configured to receive the amplified-modulated signal and output a demodulated signal; and
a notch filter coupled to the second chopper, the notch filter configured to receive the demodulated signal and to output a filtered demodulated signal as the compensation signal.

9. The chopper-stabilized amplifier according to claim 8, wherein the second mux-interface circuit blocks an input current from being conducted by the first chopper while the inner input signal is in the slew condition.

10. The chopper-stabilized amplifier according to claim 1, wherein the slew-detector circuit includes:
a minimum voltage selector circuit coupled to the first path, the minimum voltage selector circuit configured to:
receive the inner input signal from the first path; and
output a lower-supply voltage (VSL) based on a minimum of a positive inner node voltage (VINTP) and a negative inner node voltage (VINTN) of the inner input signal;
a floating-supply circuit coupled to the minimum voltage selector circuit, the floating-supply circuit configured to:
generate a higher-supply voltage (VSH) at a fixed voltage above the lower-supply voltage (VSL); and
output the higher-supply voltage (VSH) and the lower-supply voltage (VSL); and a window floating comparator coupled to the floating-supply circuit and the first path, the window floating comparator configured to:
  compare the inner input signal from the first path to a voltage window; and
  output a slew signal based on the comparison, the slew signal controlling the second mux-interface circuit.

11. The chopper-stabilized amplifier according to claim 10, wherein the minimum voltage selector circuit includes:
  a first Schottky diode coupled at a first cathode to a positive inner voltage (VINTP) of the first path; and
  a second Schottky diode coupled at a second cathode to a negative inner voltage (VINTN) of the first path, a first anode of the first Schottky diode coupled to a second anode of the second Schottky diode to output a lower supply voltage (VSL) based on a minimum of the positive inner voltage (VINTP) and the negative inner voltage (VINTN).

12. The chopper-stabilized amplifier according to claim 1, further including a settling-enhancer circuit that is controlled by the slew-detector circuit, the settling-enhancer circuit enabled by the slew-detector circuit to prevent a voltage in the chopper amplifier circuit from changing while the inner input signal is in the slew condition.

13. The chopper-stabilized amplifier according to claim 12, wherein the settling-enhancer circuit is coupled to an input of a notch filter of the chopper amplifier circuit and to an output of the notch filter of the chopper amplifier circuit, the settling-enhancer circuit configured by a slew signal generated by the slew-detector circuit to hold the input of the notch filter and the output of the notch filter at a reference voltage.

14. The chopper-stabilized amplifier according to claim 13, further including an analog-level shifter coupled between the slew-detector circuit and the settling-enhancer circuit, the analog-level shifter configured to convert the slew signal from a floating voltage domain to a fixed voltage domain.

15. A multiplexed measurement system comprising:
  a multiplexer configured to couple a plurality of measurements to an output; and
  a chopper-stabilized amplifier configured to receive an input signal from the output of the multiplexer, the chopper-stabilized amplifier including:
    a first mux-friendly interface circuit configured to receive the input signal and to output an inner input signal to a first path, the first mux-friendly interface circuit further configured to limit an input voltage of the input signal without increasing an input current of the input signal;
    a main amplifier including a primary input configured to receive the inner input signal from the first path and an auxiliary input configured to receive a compensation signal from a second path;
    a chopper amplifier circuit in the second path configured to receive the inner input signal from the first path and to output the compensation signal to the auxiliary input;
    a second mux-friendly interface circuit in the second path configured to couple and decouple the chopper amplifier circuit to and from the first path; and
    a slew-detector circuit coupled to the first path and configured to detect that the inner input signal is in a slew condition and transmit, in response to the detection, a slew signal to configure the second mux-friendly interface circuit to decouple the second path from the first path while the input signal is in the slew condition.

16. The multiplexed measurement system according to claim 15, wherein the second mux-friendly interface circuit blocks a low-impedance path between an input of the chopper-stabilized amplifier and the chopper amplifier circuit to reduce an in-rush of input current to the chopper-stabilized amplifier during the slew condition.

17. The multiplexed measurement system according to claim 15, wherein the slew-detector circuit includes a window floating comparator configured to determine if an inner-input signal is within a voltage window to detect the slew condition.

18. The multiplexed measurement system according to claim 17, wherein the slew-detector circuit includes:
  a minimum voltage selector circuit coupled to the first path, the minimum voltage selector circuit configured to:
    output a lower-supply voltage (VSL);
  a floating-supply circuit coupled to the minimum voltage selector circuit, the floating-supply circuit configured to:
    generate a higher-supply voltage (VSH) at a fixed voltage above the lower-supply voltage (VSL); and
  the window floating comparator coupled to the floating-supply circuit.

19. The multiplexed measurement system according to claim 15,
  wherein the chopper amplifier circuit includes:
    a first chopper coupled to the second mux-friendly interface circuit;
    a null amplifier coupled to the first chopper;
    a second chopper coupled to the null amplifier; and
    a notch filter coupled to the second chopper.

20. The multiplexed measurement system according to claim 19,
  wherein the slew signal configures the second mux-friendly interface circuit to block the input current from being conducted by the first chopper.

* * * * *